(12) United States Patent
Cheng et al.

(10) Patent No.: US 9,472,444 B2
(45) Date of Patent: Oct. 18, 2016

(54) WAFER SUPPORT DEVICE

(75) Inventors: Tien-Chih Cheng, Zhubei (TW); Ying Zhang, Hsinchu (TW); Shu-Huei Suen, Zhudong Township, Hsinchu County (TW); Chen-Chiao Kao, New Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 13/593,479

(22) Filed: Aug. 23, 2012

(65) Prior Publication Data

US 2014/0057052 A1 Feb. 27, 2014

(51) Int. Cl.
| | |
|---|---|
| *B05C 13/00* | (2006.01) |
| *B23B 31/28* | (2006.01) |
| *B05D 1/02* | (2006.01) |
| *B05C 11/00* | (2006.01) |
| *B05D 3/12* | (2006.01) |
| *H01L 21/687* | (2006.01) |

(52) U.S. Cl.
CPC ..... *H01L 21/6875* (2013.01); *H01L 21/68757* (2013.01); *Y10T 279/23* (2015.01)

(58) Field of Classification Search
CPC .............. H01L 21/6975; H01L 21/68757; Y10T 279/23
USPC .......................................................... 427/331
See application file for complete search history.

(56) References Cited

U.S. PATENT DOCUMENTS

| | | | | |
|---|---|---|---|---|
| 5,324,053 A * | 6/1994 | Kubota | .................. | B23Q 3/154 269/8 |
| 5,535,507 A | 7/1996 | Barnes et al. | | |
| 5,646,814 A * | 7/1997 | Shamouilian | ....... | H01L 21/6831 361/234 |
| 6,108,189 A * | 8/2000 | Weldon | ............... | C23C 16/4586 279/128 |
| 6,370,007 B2 * | 4/2002 | Takahasi | ............. | H01L 21/6833 361/234 |
| 2001/0019472 A1 * | 9/2001 | Kanno | ................ | H01L 21/6833 361/234 |
| 2003/0090070 A1 * | 5/2003 | Endou | .................... | B23Q 3/154 279/128 |

OTHER PUBLICATIONS

Office Action Taiwanese Patent Application No. 10520566720 dated May 9, 2016.

* cited by examiner

*Primary Examiner* — Dah-Wei D Yuan
*Assistant Examiner* — Kristen A Dagenais
(74) *Attorney, Agent, or Firm* — McDermott Will & Emery LLP

(57) ABSTRACT

A wafer support device is provided. The wafer support device includes a plurality of support portions; and a bottom area located among the support portions, wherein the bottom area has a protective layer formed thereon. A method for processing a working surface of a wafer support device is also provided.

19 Claims, 7 Drawing Sheets

WAFER SUPPORT DEVICE

FIELD

The present disclosure relates to a support device, and more particularly to a wafer support device.

BACKGROUND

The particles on the wafer backside have become one of the major defect sources for many generations of technologies. Due to the technology node advancement, pitch shrinking, and an increasing number of processing steps required, the reduction of the particles on the wafer backside becomes one of the keys for the yield performance.

The electrostatic chuck (ESC) is a device for supporting the wafer. Generally, the ESC includes a plurality of support portions for supporting the wafer and a bottom area. When the ESC is manufactured, the surface of the bottom area is rough due to the material thereof. Such roughness is unable to be removed by the wet clean. When performing the dry etching process, such roughness is easy to be wiped out by the plasma to become the particles contaminating the wafer backside. Besides, the polymers generated during the semiconductor processes may fall on the bottom area of the ESC and be stuck in the rough surface thereof. Accordingly, the generated polymers are hard to remove, and also become the particles contaminating the wafer backside.

After the wafer is processed on the ESC, it will be returned to the front opening unified pod (FOUP) for temporary storage and transmission. Generally, the FOUP stores a plurality of wafers, wherein a wafer's backside faces another wafer's front side. Therefore, when a wafer is returned to the FOUP, if the backside of the wafer is contaminated by particles, the particles will fall on the front side of another wafer thereunder, thereby contaminating another wafer. Besides the problem of the particles on the wafer backside, the lifetime of the ESC will also be shortened due to the particle contamination. Hence, there is a need to solve the above problems.

SUMMARY

In accordance with one aspect of the present disclosure, a method for processing a working surface of a wafer support device is provided. The wafer support device is to support a wafer and has a wafer-contacting surface. The method includes steps of disposing a protective layer onto the working surface, wherein the protective layer includes a specific portion covering the wafer-contacting surface; and removing the specific portion.

In accordance with another aspect of the present disclosure, a wafer apparatus is provided. The wafer apparatus includes a wafer support device having a working surface, and a wafer-contacting surface for supporting thereon a wafer; a spray device spraying a protective material onto the working surface to form a protective layer, wherein the protective layer includes a specific portion covering the wafer-contacting surface; and a grind device grinding the specific portion after the spray device sprays the protective material onto the working surface.

In accordance with one more aspect of the present disclosure, a wafer support device is provided. The wafer support device includes a plurality of support portions; and a bottom area located among the support portions, wherein the bottom area has a protective layer formed thereon.

The above objects and advantages of the present invention will become more readily apparent to those ordinarily skilled in the art after reviewing the following detailed descriptions and accompanying drawings, in which:

DETAILED DESCRIPTION

Figure 1A:
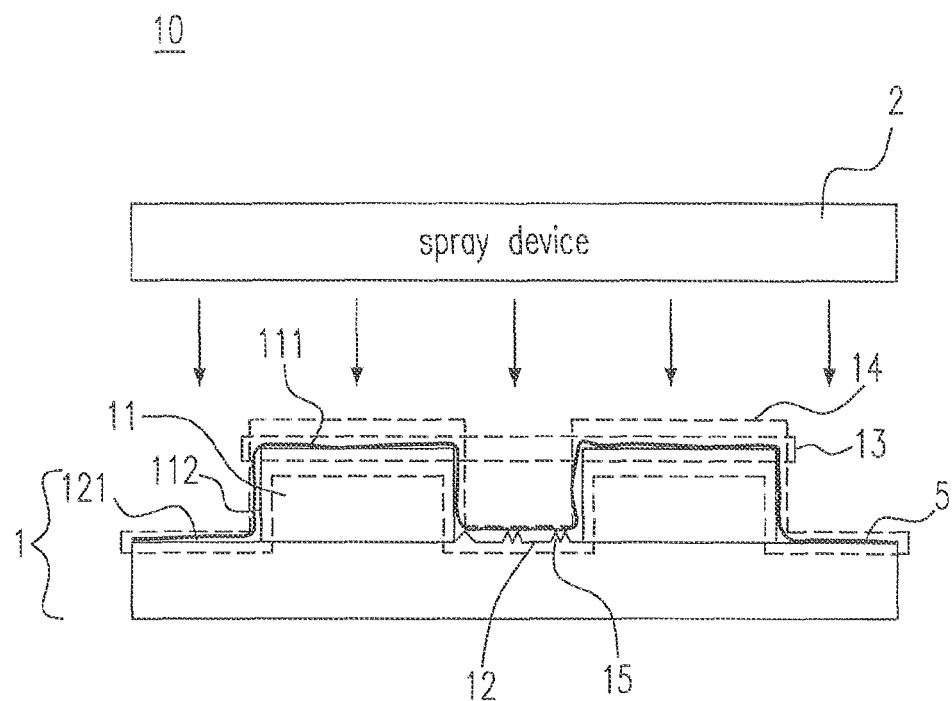
FIGS. 1(a) and 1(b) show a wafer apparatus according to various embodiments of the present disclosure.

The present invention will be described with respect to particular embodiments and with reference to certain drawings, but the invention is not limited thereto but is only limited by the claims. The drawings described are only schematic and are non-limiting. In the drawings, the size of some of the elements may be exaggerated and not drawn to scale for illustrative purposes. The dimensions and the relative dimensions do not necessarily correspond to actual reductions to practice.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments described herein are capable of operation in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that the embodiments described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to a device consisted only of components A and B.

Reference throughout this specification to "one embodiment" or "an embodiment" means that a particular feature, structure or characteristic described in connection with the embodiment is included in at least one embodiment. Thus, appearances of the phrases "in one embodiment" or "in an embodiment" in various places throughout this specification are not necessarily all referring to the same embodiment, but may. Furthermore, the particular features, structures or methods may be combined in any suitable manner, as would be apparent to one of ordinary skill in the art from this disclosure, in one or more embodiments.

Similarly it should be appreciated that in the description of exemplary embodiments, various features are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments may be practiced without these specific details. In other instances, well-known methods, structures and techniques have not been shown in detail in order not to obscure an understanding of this description.

The invention will now be described by a detailed description of several embodiments. It is clear that other embodiments can be configured according to the knowledge of persons skilled in the art without departing from the true technical teaching of the present disclosure, the claimed invention being limited only by the terms of the appended claims.

Figure 1B:
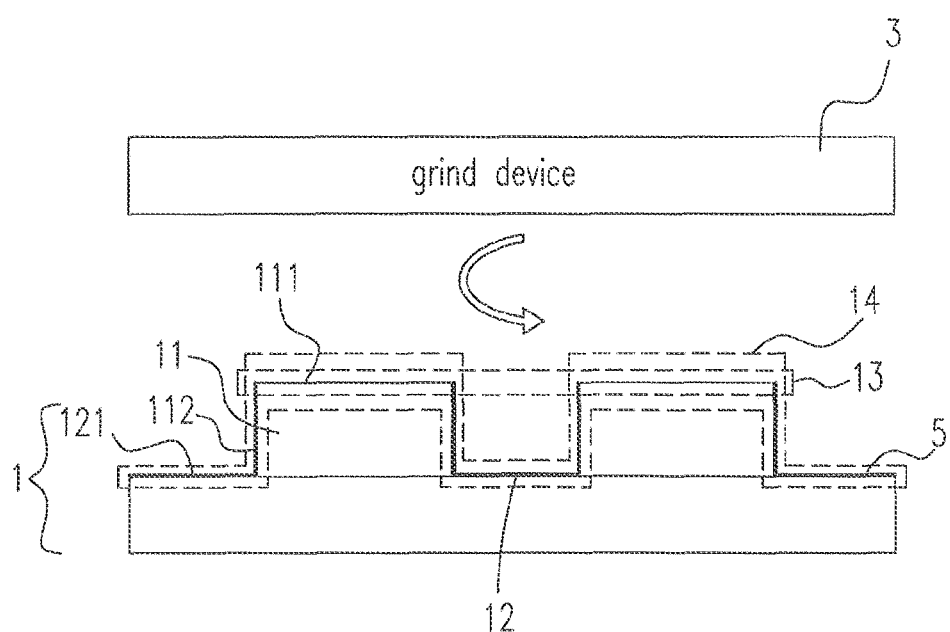
Figure 3:
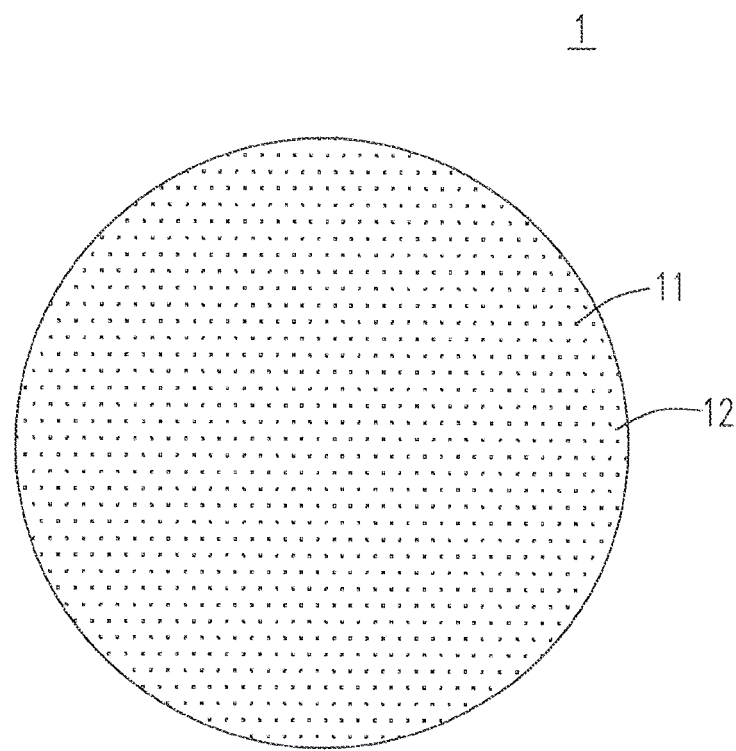
FIG. 3 is a top view of the wafer support device of FIG. 1(b)

FIGS. 1(a) and 1(b) show a wafer apparatus 10 according to various embodiments of the present disclosure. The wafer apparatus 10 includes a wafer support device 1, a spray device 2 and a grind device 3. The wafer support device 1 has a working surface 14 and a wafer-contacting surface 13. A plurality of support portions 11 and a bottom area 12 are located among the support portions 11 of the wafer support device 1, as shown in FIG. 3, which is a top view of the wafer support device 1. The support portions 11 may be cylindrical, for example. Each support portion 11 has a top surface 111 and a lateral surface 112. The bottom area 12 has a bottom surface 121. The working surface 14 of the wafer support device 1 includes the top surface 111 and the lateral surface 112 of each support portion 11 and the bottom surface 121 of the bottom area 12. The wafer-contacting surface 13 of the wafer support device 1 includes the top surface 111 of each support portion 11.

Figure 2:
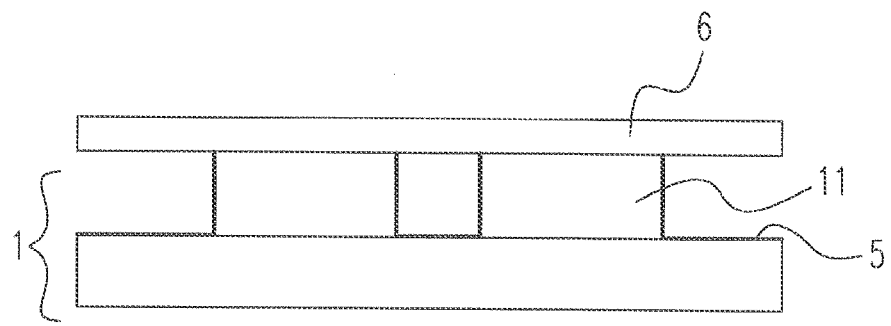
FIG. 2 shows a wafer being supported by the wafer support device of FIG. 1(b)

As shown in FIG. 1(a), the bottom surface 121 of the bottom area 12 has roughness 15 before being processed by the technology of the present disclosure. In order to solve the problem caused by the roughness 15, the spray device 2 and the grind device 3 are provided in the present disclosure. Firstly, the spray device 2 sprays a protective material onto the working surface 14 to form a protective layer 5, as shown in FIG. 1(a). The protective layer 5 covers the roughness 15 so that the roughness 15 is not exposed. The protective layer 5 includes a specific portion covering the wafer-contacting surface 13. Secondly, the grind device 3 grinds the specific portion, as shown in FIG. 1(b). Thirdly, a cleaning process is performed to remove the residue of the protective material left after the grinding process. After the above-mentioned steps, a wafer 6 can be placed on the support portions 11 for subsequent semiconductor processes without the contamination of the particles caused by the roughness 15, as shown in FIG. 2.

In some embodiments, the height of each support portion can be 50 um, and the radius thereof can be 1 mm. In some embodiments, the pitch between the support portions 11 can be 4 mm.

In some embodiments, the protective material can be an anticorrosive and electrically insulating material. The anticorrosive and electrically insulating material can be $Y_2O_3$, $Al_2O_3$, silicon, $SiO_2$ or a Teflon. The Teflon may be polytetrafluoroethylene (PTFE), perfluoroalkoxy (PFA), or fluorinated ethylene propylene (FEP). In some other embodiments, the protective material can be any other type of material having anticorrosive and electrically insulating properties.

In some embodiments, the thickness of the protective layer 5 can be 10 um.

The purpose of spraying the protective material is to smooth the bottom surface 121 of the bottom area 12. In this way, the bottom surface 121 of the bottom area 12 becomes smooth and clean, so that the particles are not generated when performing a dry etching process with a plasma. Accordingly, the backside of the wafer 6 is not contaminated by the particles. Moreover, since the bottom surface 121 of the bottom area 12 becomes smooth, it can be kept clean after the semiconductor processes by the plasma and wet clean. That is, the polymers generated in the subsequent semiconductor processes can be removed easily by the plasma and wet clean. Accordingly, the backside of the wafer 6 is not contaminated by the polymers, either. Since the backside of the wafer 6 is not contaminated by the particles and polymers, when the wafer 6 is returned to the FOUP, the front side of another wafer (not shown) under the wafer 6 is not contaminated by the particles and polymers, either.

The purpose of grinding the specific portion is to grind the protective layer 5 on the wafer-contacting surface 13, i.e. to grind the protective layer 5 on the top surface 111 of each support portion 11 to make it smooth and even. The grind device 3 stops grinding while touching the ceramic material of the top surface 111 of each support portion 11. Since the top surface 111 of each support portion 11 contacts the wafer 6, if the protective layer 5 thereon is not grinded, the top surface 111 might not be even enough for the wafer 6 to be firmly supported by the wafer support device 1. Hence, the step of grinding the specific portion is provided in the present disclosure to make sure that the wafer 6 can be firmly supported by the wafer support device 1. The protective layer 5 on the lateral surface 112 of each support portion 11 and that on the bottom surface 121 of the bottom area 12 are not grinded.

In some embodiments, the grind device 3 grinds the protective layer 5 on the top surface 111 of each support portion 11 with a slurry.

In some embodiments, the wafer support device 1 can be an electrostatic chuck (ESC). The ESC can be a 300 mm ESC or a 450 mm ESC. In other embodiments, the wafer support device 1 can be any other type of device that can support the wafer 6.

Figure 4:
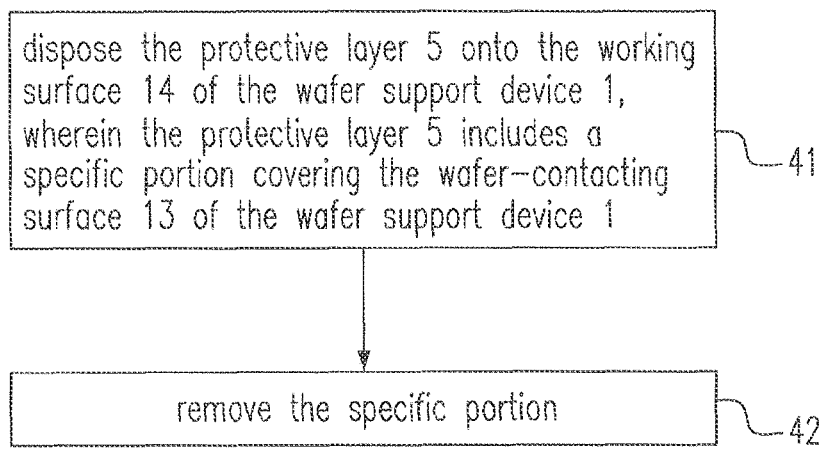
FIG. 4 shows a flowchart of a method for processing the working surface of the wafer support device of FIG. 1(b) according to various embodiments of the present disclosure.

Please refer to FIGS. 1(a), 1(b) and 4 simultaneously. FIG. 4 shows a flowchart of a method for processing the working surface 13 of the wafer support device 1 of FIG. 1(b) according to various embodiments of the present disclosure. The method includes the following steps. The protective layer 5 is disposed onto the working surface 14 of the wafer support device 1 in step 41. The protective layer 5 includes a specific portion covering the wafer-contacting surface 13 of the wafer support device 1. The specific portion is removed in step 42. The step of disposing the protective layer 5 includes a sub-step of spraying the protective material onto the working surface 14 of the wafer support device 1 to form the protective layer 5. The step of removing the specific portion includes a sub-step of grinding the specific portion. The protective layer 5 on the lateral surface 112 of each support portion 11 and that on the bottom surface 121 of the bottom area 12 are not grinded.

In some embodiments, the method for processing the working surface 13 of the wafer support device 1 of the present disclosure is performed only once after the wafer support device 1 is manufactured. After performing the above-mentioned method, the wafer support device 1 can be used for several years. During these years, when the polymers are generated in the subsequent semiconductor processes, they can be easily removed by the plasma and wet clean. Accordingly, the backside of the wafer 6 will not be contaminated by the polymers.

In some embodiments, the protective material can be an anticorrosive and electrically insulating material. The anticorrosive and electrically insulating material can be $Y_2O_3$, $Al_2O_3$, silicon, $SiO_2$ or a Teflon. The Teflon may be polytetrafluoroethylene (PTFE), perfluoroalkoxy (PFA), or fluorinated ethylene propylene (FEP). In some other embodiments, the protective material can be any other type of material that has the anticorrosive and electrically insulating properties.

In some embodiments, the thickness of the protective layer 5 can be 10 um.

In some embodiments, the wafer support device 1 can be an electrostatic chuck (ESC). The ESC can be a 300 mm ESC or a 450 mm ESC. In some other embodiments, the wafer support device 1 can be any other type of device that can support the wafer 6.

Figure 5:
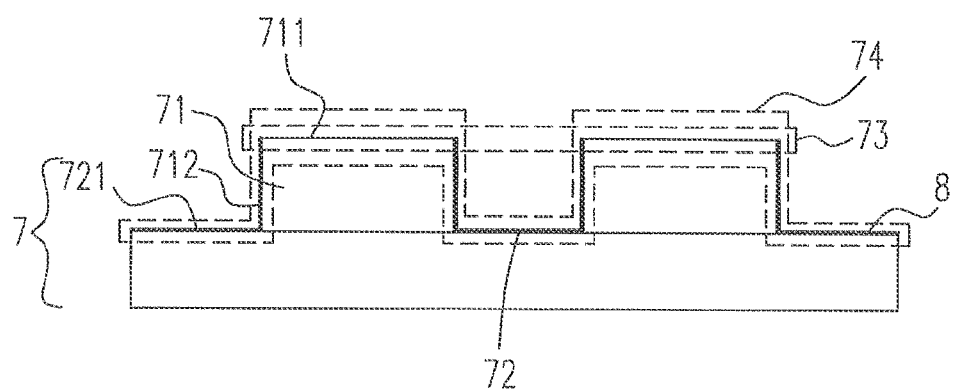
FIG. 5 shows a wafer support device according to various embodiments of the present disclosure.
Figure 7:
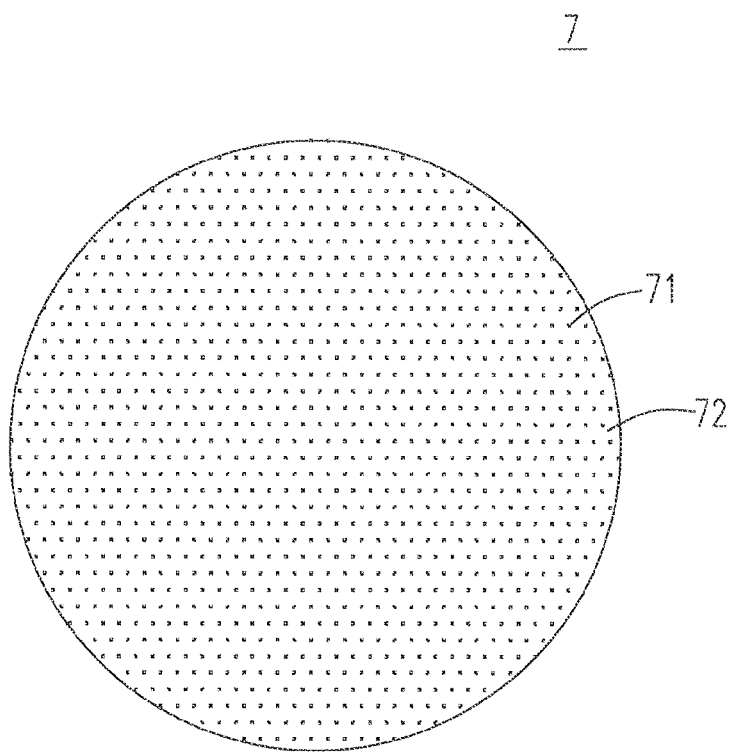
FIG. 7 is a top view of the wafer support device of FIG. 5.

FIG. 5 shows a wafer support device 7 according to various embodiments of the present disclosure. The wafer support device 7 has a working surface 74 and a wafer-contacting surface 73. The wafer support device 7 includes a plurality of support portions 71 and a bottom area 72 located among the support portions 71 as shown in FIG. 7, which is a top view of the wafer support device 7. The support portions 71 may be cylindrical, for example. Each support portion 71 has a top surface 711 and a lateral surface 712. The bottom area 72 has a bottom surface 721. The working surface 74 of the wafer support device 7 includes the top surface 711 and the lateral surface 712 of each support portion 71 and the bottom surface 721 of the bottom area 72. The wafer-contacting surface 73 of the wafer support device 7 includes the top surface 711 of each support portion 71.

Figure 6:
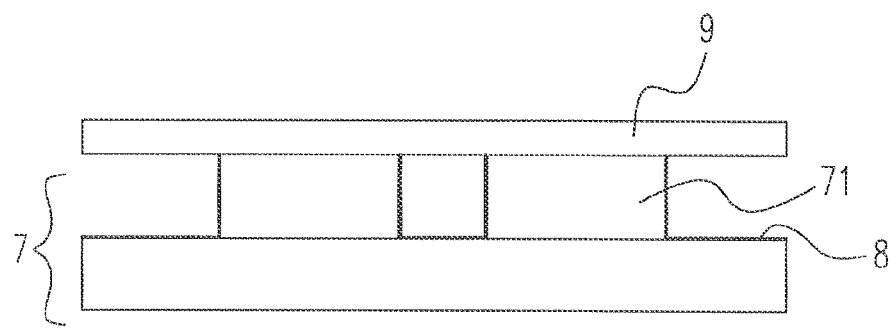
FIG. 6 shows a wafer being supported by the wafer support device of FIG. 5.

The bottom area 72 has a protective layer 8 formed thereon. The lateral surface 712 of each support portion 71 also has the protective layer 8 formed thereon. A wafer 9 can be placed on the support portions 71 for subsequent semiconductor processes, as shown in FIG. 6.

In some embodiments, the height of each support portion can be 50 um, and the radius thereof can be 1 mm. In some embodiments, the pitch between the support portions 11 can be 4 mm.

In some embodiments, the protective layer 8 includes a protective material. The protective material can be an anticorrosive and electrically insulating material. The anticorrosive and electrically insulating material can be $Y_2O_3$, $Al_2O_3$, silicon, $SiO_2$ or a Teflon. The Teflon may be polytetrafluoroethylene (PTFE), perfluoroalkoxy (PFA), or fluorinated ethylene propylene (FEP). In some other embodiments, the protective material can be any other type of material having the anticorrosive and electrically insulating properties.

In some embodiments, the thickness of the protective layer 5 can be 10 um.

With the protective layer 8, the bottom surface 721 of the bottom area 72 are smooth and clean, so that the particles are not generated when performing the dry etching process with the plasma. Accordingly, the backside of the wafer 9 is not contaminated by the particles. Moreover, since the bottom surface 721 of the bottom area 72 is smooth, it can be kept clean after the semiconductor processes by the plasma and wet clean. That is, the polymers generated in the subsequent semiconductor processes can be easily removed by the plasma and wet clean. Accordingly, the backside of the wafer 9 is not contaminated by the polymers, either. Since the backside of the wafer 9 is not contaminated by the particles and polymers, when the wafer 9 is returned to the FOUP, the front side of another wafer (not shown) under the wafer 9 is not contaminated by the particles and polymers, either.

Since the top surface 711 of each support portion 71 contacts the wafer 9, if it has the protective layer 8 formed thereon, it may not be even enough for the wafer 9 to be firmly supported by the wafer support device 7. Hence, to make sure that the wafer 9 can be firmly supported by the wafer support device 7, the top surface 711 of each support portion 71 has no protective layer 8 formed thereon.

In some embodiments, the wafer support device 7 can be an electrostatic chuck (ESC). The ESC can be a 300 mm ESC or a 450 mm ESC. In other embodiments, the wafer support device 7 can be any other type of device that can support the wafer 9.

Figure 8:
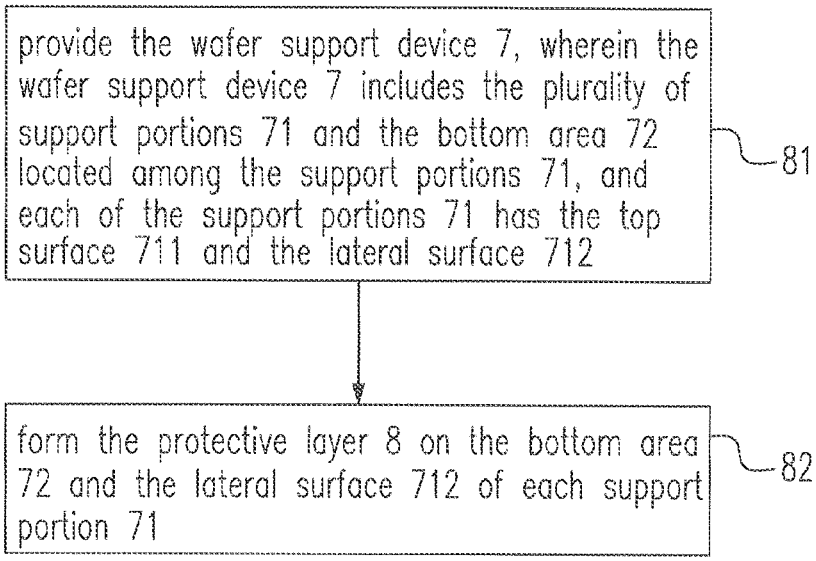
FIG. 8 shows a flowchart of a method for manufacturing the wafer support device of FIG. 5 according to various embodiments of the present disclosure.

Please refer to FIGS. 5 and 8 simultaneously. FIG. 8 shows a flowchart of a method for manufacturing the wafer support device 7 of FIG. 5 according to various embodiments of the present disclosure. The method includes the following steps. The wafer support device 7 is provided in step 81. The wafer support device 7 includes the plurality of support portions 71 and the bottom area 72 located among the support portions 71, and each of the support portions 71 has the top surface 711 and the lateral surface 712. The protective layer 8 is formed on the bottom area 72 and the lateral surface 712 of each support portion 71 in step 82.

In some embodiments, the wafer support device 7 provided in step 81 can be an electrostatic chuck (ESC). The ESC can be a 300 mm ESC or a 450 mm ESC. In some other embodiments, the wafer support device 7 provided in step 81 can be any other type of device that can support the wafer 9.

In some embodiments, the height of each support portion can be 50 um, and the radius thereof can be 1 mm. In some embodiments, the pitch between the support portions 11 can be 4 mm.

In some embodiments, the protective layer 8 formed in step 82 includes a protective material. The protective material can be an anticorrosive and electrically insulating material. The anticorrosive and electrically insulating material can be $Y_2O_3$, $Al_2O_3$, silicon, $SiO_2$ or a Teflon. In some other embodiments, the protective material can be any other type of material that has the anticorrosive and electrically insulating properties.

Based on the above, the present disclosure has the following advantages. The wafer backside particles and cross-contamination issues are eliminated in a simple, reliable and cost-effective way to increase the yield. The cross-contamination issue is generated when the wafer is in transit, at which time the wafer may contaminate other semiconductor devices due to the particles falling from the wafer backside. Hence, if the particles on the wafer backside can be eliminated, the cross-contamination issue can be avoided. Since the method of the present disclosure can effectively eliminate the particles on the wafer backside, the cross-contamination issue can be successfully avoided.

Since the color of the protective layer 5, 8 is different from that of the working surface 14, 74 of the wafer support device 1, 7, presence of the protective layer 5, 8 on the working surface 14, 74 of the wafer support device 1, 7 is easily detected. For example, if the color of the protective layer 5, 8 is white and that of the working surface 14, 74 of the wafer support device 1, 7 is gray, one can easily determine that the working surface 14, 74 of the wafer support device 1, 7 is provided with the protective layer 5, 8 due to the color difference. Then, one can determine whether to perform the method of the present disclosure for the wafer support device 1, 7 or not.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all such modifications and similar structures.

What is claimed is:

1. A method for processing a working surface of a wafer support device, wherein the wafer support device is to support a wafer, has a wafer-contacting surface, and includes a plurality of support portions and a bottom area located between adjacent support portions, wherein each of the support portions has a top surface and a lateral surface, the bottom area has a bottom surface, the working surface includes the top surface and the lateral surface of each support portion and the bottom surface of the bottom area, and the wafer-contacting surface includes the top surface of each support portion, comprising steps of:
   disposing a protective layer onto the top surface and the lateral surface of each support portion and the bottom surface of the bottom area of the working surface, wherein the protective layer includes a specific portion covering the wafer-contacting surface; and
   removing the specific portion to expose the wafer-contacting surface,
   wherein each of the plurality of support portions is arranged at equal intervals with respect to adjacent support portions, and
   wherein the plurality of support portions are arranged in parallel lines such that the plurality of support portions in adjacent lines are offset from each other.

2. The method as claimed in claim 1, wherein:
the wafer support device is an electrostatic chuck (ESC).

3. The method as claimed in claim 1, wherein the protective layer includes a protective material, and the step of disposing the protective layer comprises a sub-step of spraying the protective material onto the working surface to form the protective layer.

4. The method as claimed in claim 3, wherein the protective material comprises an anticorrosive and electrically insulating material.

5. The method as claimed in claim 4, wherein the anticorrosive and insulating material comprises one selected from a group consisting of $Y_2O_3$, $Al_2O_3$, silicon, $SiO_2$ and a Teflon.

6. The method as claimed in claim 1, wherein the step of removing the specific portion comprises a sub-step of grinding the specific portion.

7. The method as claimed in claim 1, wherein adjacent wafer-contacting surfaces from the top view are separated by a distance of 4 mm.

8. The method as claimed in claim 1, wherein a radius of the wafer-contacting surface from the top view is 1 mm.

9. The method as claimed in claim 1, wherein the disposing the protective layer comprises disposing the protective layer having a thickness of 10 microns.

10. The method as claimed in claim 1, wherein the removing the specific portion comprises grinding the specific portion with a slurry.

11. A method for processing a working surface of a wafer support device, wherein the working surface comprises a plurality of support portions and a bottom area, the support portions protruding from the bottom area, the method comprises:
   disposing a protective layer over the support portions and the bottom area so as to form a flat bottom surface at the bottom area; and
   exposing a top surface of the support portions by removing the protective layer at the top surface of the support portions,
   wherein each of the plurality of support portions is arranged at equal intervals with respect to adjacent support portions, and
   wherein each of the plurality of support portion is surrounded by six adjacent support portions.

12. The method as claimed in claim 11, wherein the support portions from a top view comprise a radius of 1 mm.

13. The method as claimed in claim 11, wherein the support portions further comprise a lateral surface covered by the protective layer.

14. The method as claimed in claim 11, wherein the disposing the protective layer comprises depositing a protective thickness of 10 microns.

15. The method as claimed in claim 11, wherein the interval between adjacent support portions is 4 mm.

16. The method as claimed in claim 11, wherein the color of the protective layer comprises white.

17. The method as claimed in claim 11, wherein the protective layer comprises anticorrosive and insulating material.

18. The method as claimed in claim 17, wherein the anticorrosive and insulating material comprises one selected from a group consisting of $Y_2O_3$, $Al_2O_3$, silicon, $SiO_2$ and a Teflon.

19. The method as claimed in claim 11, wherein the removing the protective layer at the top surface of the support portions comprises grinding the protective layer with a slurry.

* * * * *